United States Patent
Otto

(10) Patent No.: US 6,202,287 B1
(45) Date of Patent: *Mar. 20, 2001

(54) METHOD FOR PRODUCING BIAXIALLY ALIGNED SUPER CONDUCTING CERAMICS

(75) Inventor: Alexander Otto, Chelmsford, MA (US)

(73) Assignee: American Superconductor Corporation, Westborough, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/588,605

(22) Filed: Jan. 18, 1996

(51) Int. Cl.$^7$ ..................................... H01L 39/24
(52) U.S. Cl. ......................... 29/599; 505/430; 505/431; 505/433; 505/500
(58) Field of Search .................................. 505/430, 431, 505/433, 500, 501

(56) References Cited

U.S. PATENT DOCUMENTS

| | | |
|---|---|---|
| 4,962,085 | 10/1990 | DeBarbadillo, II et al. . |
| 5,068,219 | 11/1991 | Hagino et al. ........................... 505/1 |
| 5,075,286 | 12/1991 | Powell et al. . |
| 5,106,824 * | 4/1992 | Uno et al. ............................. 505/430 |
| 5,204,316 | 4/1993 | Arendt et al. ............................. 505/1 |
| 5,232,907 * | 8/1993 | Matsuhiro et al. .................. 505/500 |
| 5,525,584 * | 6/1996 | Murakami et al. ............. 505/500 X |
| 5,661,114 * | 8/1997 | Otto et al. ............................. 505/501 |
| 5,683,969 * | 11/1997 | Masur et al. ....................... 29/599 X |
| 6,038,462 * | 3/2000 | Snitchler et al. . |
| 6,066,599 * | 5/2000 | Otto et al. . |

FOREIGN PATENT DOCUMENTS

| | | | |
|---|---|---|---|
| 0 503 525 A1 | 3/1992 | (EP) | ............................... H01B/12/00 |
| 5-89730 | 4/1993 | (JP) | ............................... H01B/13/00 |
| 5-325667 | 12/1993 | (JP) | ............................... H01B/12/10 |
| 6-68729 | 3/1994 | (JP) | ............................... H01B/13/00 |
| 06325633 | 11/1994 | (JP) | ............................... H01B/12/10 |
| 06325634 | 11/1994 | (JP) | ............................... H01B/12/10 |

OTHER PUBLICATIONS

A.Ginsbach et al, Electrical and Structural Properties of $YB_{a2}C_{ud}O_7$ Films On PO and Single Crystalline Oxides of $C_u$ and $N_i$,Physica C, pp. 185–189, (1991).

A. Ginsbach et al, "Growth of C–Axis Oriented $YB_aC_uO$ Films on Oxidized Textured Ni Sheets and on (100) and (110) Oriented $N_iO$ Single Crystals" IEEE Transactions on Magnetics, vol. 27, No. 2, Mar. 1991, 1410–1413.

H. Yoshino et al, "Improvement of In–Plane Alignment of Grains in YBCO Films on Ag Tapes", Advances in Superconductivity VI, pp. 759–762.

* cited by examiner

Primary Examiner—Carl J. Arbes
(74) Attorney, Agent, or Firm—Fish & Richardson P.C.

(57) ABSTRACT

Methods for producing biaxially aligned superconducting ceramics are disclosed. The methods include fabricating a composite precursor formed of substantially planar filaments of a superconductor precursor surrounded by a matrix, and thermomechanically processing the precursor to texture at least the interfacial layers with the matrix without converting appreciable amounts of the composite precursor to the superconducting oxide to form a preliminary filament material. The method also includes reaction texturing the preliminary filament material to form and texture a superconducting oxide. Reaction texture involves first heating at relatively low oxygen pressure, then heating at higher oxygen pressure.

53 Claims, 6 Drawing Sheets

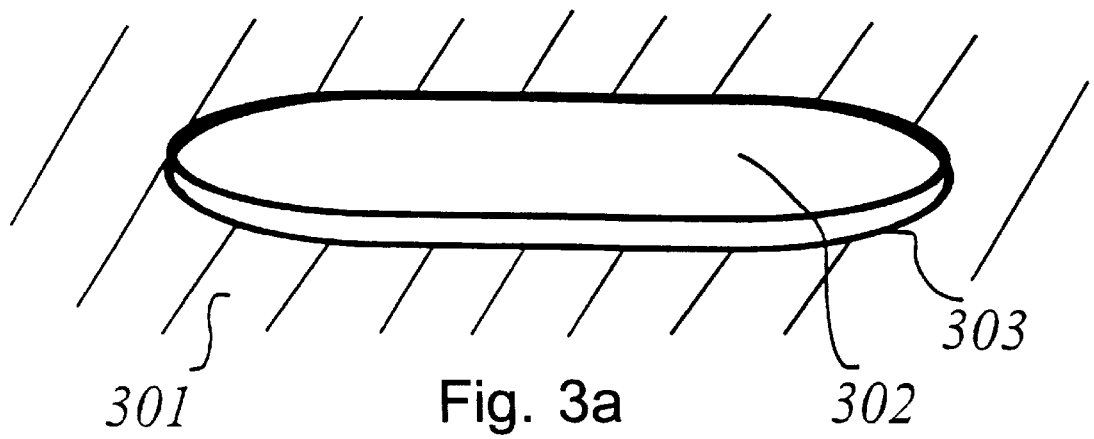
301  Fig. 3a  302  303
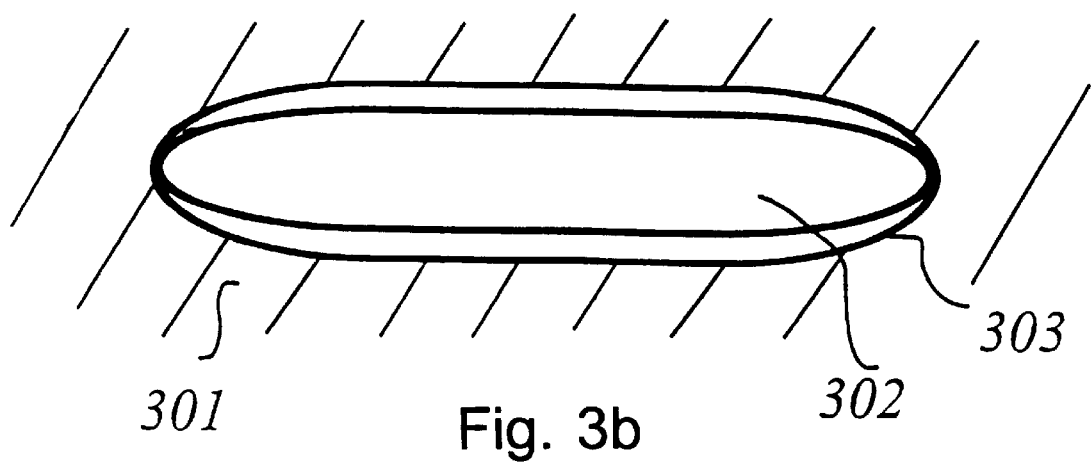
301  Fig. 3b  302  303
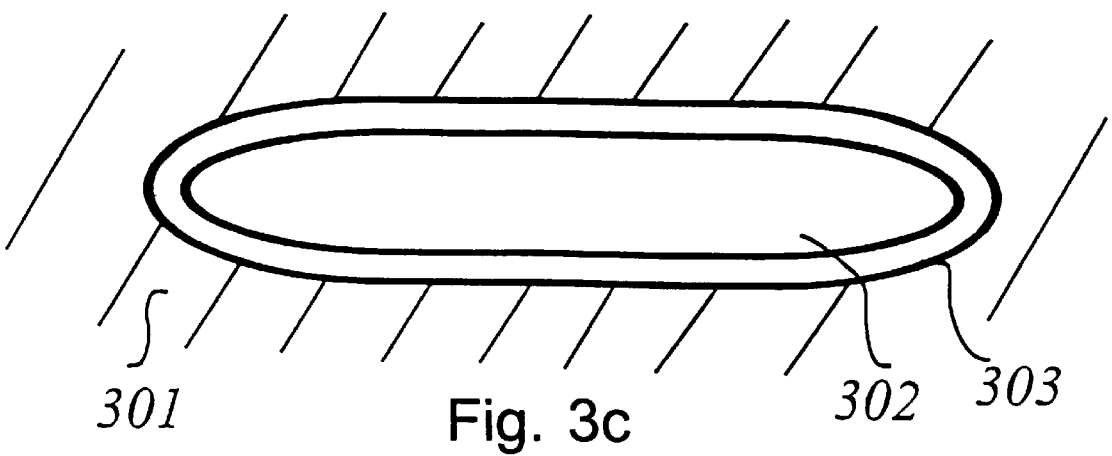
301  Fig. 3c  302  303

METHOD FOR PRODUCING BIAXIALLY ALIGNED SUPER CONDUCTING CERAMICS

GOVERNMENT RIGHTS IN INVENTION

This invention was made under SBIR/DMI Award No. DMI-9461645 from the National Science Foundation. The Government has certain rights in this invention.

BACKGROUND OF THE INVENTION

1. Field of the Invention

This invention relates to processes for producing highly textured, biaxially aligned superconducting ceramics in composite conductor forms from metallic precursors, and to the resultant articles.

2. Background of the Invention

Since their discovery less than a decade ago, the superconducting ceramics have attracted wide interest, but many practical applications hinge on their ability to carry currents (below critical temperature, field and current values which are characteristic of each material) almost without resistive losses. The potential of these materials to support high current densities ($J_c$'s) has been demonstrated by the high values achieved with epitaxially grown thin films in small sample sizes. However, in the bulk forms desired for most electrical and magnetic applications, reported $J_c$'s are much lower because of losses at the boundaries between the individual grains of polycrystalline material. Lower $J_c$'s, for example, are typical of composites formed, for example, by the well-known powder-in-tube (PIT) process. Nonetheless, composite conductors produced using PIT techniques are considered the most promising choice for bulk electrical and magnetic applications, as they offer better mechanical properties than the brittle superconducting oxides alone can provide and a scalable, cost-effective method of manufacturing long lengths of wires and tapes.

PIT conductors are composites including one or more filaments of superconducting material in intimate contact with a metal matrix. Several variations have been developed, depending on the type of precursor material used. These are described, for example, in A. Otto, L. J. Masur, C. Craven, D. Daly, E. R. Podtburg, and J. Schreiber, "Progress toward a long length metallic precursor process for multifilament Bi-2223 composite superconductors", IEEE Transactions on Appl. Supercon., vol 5, No. 2 (Jan. 1995), pp. 1154–1157 in U.S. Pat. Nos. 4,826,808, and 5,189,009 to Yurek et al., in W. Gao & J. Vander Sande, Superconducting Science and Technology, Vol. 5, pp. 318–326, 1992, in C. H. Rosner, M. S. Walker, P. Haldar, and L. R. Motowido, "Status of superconducting superconductors: Progress in improving transport critical current densities in superconducting Bi-2223 tapes and coils" (presented at conference 'Critical Currents in High Tc Superconductors', Vienna, Austria, April, 1992) and K. Sandhage, G. N. Riley Jr.,. and W. L. Carter, "The oxide-powder-in-tube method for producing high current density BSCCO superconductors", Journal of Metals 43,21 (1991) which teach the use of either a mixture of powders of the oxide components of the superconductor (OPIT) or of a metal alloy powder having the nominal elemental composition corresponding to the cation stoichiometry of the desired superconducting oxide (MPIT), all of which are herein incorporated by reference.

FIG. 2 (prior art) is a schematic diagram illustrating the main steps in manufacturing superconducting composites by the prior art MPIT method. In step 201, the elemental metallic constituents of the desired superconducting ceramic are mechanically alloyed to form a homogeneous alloy powder, as further described in Otto et al, cited above. Repeated mixing, deformation, compression welding and fracture decease the length scale of phase inhomogeneity until a quasi-amorphous and malleable alloy of the elements results. In step 202, the precursor alloy powder is packed into a first malleable metal can, preferably of a noble metal, that is then sealed and longitudinally deformed in step 203, preferably by extrusion, to form a monofilamentary rod of reduced cross-section including one or more filaments of precursor material surrounded by a noble metal matrix. In step 204, cut pieces of the rod are packed into a multirod bundle that is packed into a second malleable metal can and longitudinally deformed in step 205 to form a multifilamentary rod. Steps 204 and 205 are repeated as many times as necessary to form a composite wire or tape with the desired number and size of filaments. The composite is then oxidized, to form intermediate suboxide phases from the precursor alloy, as shown in step 206, and these intermediate phases are reacted in step 209 to form a superconducting oxide which may be either the final, desired superconducting oxide or an intermediate superconducting oxide.

A key requirement for improving the Jc of polycrystalline superconducting oxides is a high degree of crystallographic alignment or texture of the superconducting grains. In conventional PIT processing, as shown in step 210, non-axisymmetric deformation is used to physically align the grains of intermediate or final superconducting oxide phases in the desired direction, namely primarily such that the c-directions of the grains are aligned orthogonally to the desired current direction along the tape axis. This type of uni-axial texturing has been particularly well developed for the PIT fabrication of the micaceous bismuth-strontium-calcium-copper-oxide (BSCCO) 2212 and 2223 superconducting phases because these oxides exhibit a modest amount of plastic deformation via the activation of a c-plane slip system.

It is important to note that in conventional PIT processing, the deformation is applied directly to the superconducting oxide phases, which either possess a single slip system as in the case of the BSCCO superconducting oxides, or no active slip system at all, as is the case with all the rare earth-containing superconducting copper oxides, the thallium-containing superconducting copper oxides and the mercury-containing superconducting copper oxides. Therefore, post elastic strain is accommodated primarily by the breakup of the oxide into particles consisting of individual superconducting grains as well as secondary phase grains, or particles that contain clusters of these phases, and the deformation then induces texture by rotating the aspected plate shaped grains of the superconducting phases such that the large flat surfaces of the grains that are orthogonal to the grain c-directions (i.e., the c-planes) align with the deformation plane. Following this type of deformation texturing, the subsequent processing must re- sinter the oxide particle fragments, as shown in step 211, via a commonly employed reaction sintering heat treatment that converts a deformation textured precursor superconductor phase to the desired superconductor (in the case of BSCCO, from BSCCO 2212 to BSCCO 2223). For some superconducting materials, a final post-sintering heat treatment, shown in step 212, may be performed to optimize the defect chemistry of the superconductor.

In spite of progress however, the utility of BSCCO superconducting phases is in doubt for field generating applications operating above about 50 K. The primary problem with even well uni-axially textured BSCCO superconducting phases attaining via PIT processing is that their Jc's degrade in small magnetic fields. Unlike the BSCCO superconducting phases (2201, 2212 and 2223) alternate superconducting copper oxide phases such as the yttrium-barium-copper-oxide (YBCO) 123, 247, and 124 phases, and the thallium-barium-calcium-copper-oxide 1212 and 1223 phases are inadequately deformation textured in PIT processes. However, suitably textured thin films of these phases do exhibit very high Jc levels in high magnetic fields above 50 K, demonstrating their intrinsic potential for use in field generating applications if long lengths of multifilament conductors with suitably textured oxide forms can be economically manufactured. FIG. 1 (prior art) shows the $J_c$ dependences on applied magnetic field for untextured, bulk melt textured and textured thin film forms of YBCO 123.

Although direct deformation induced bi-axial texture has been reported for the YBCO 124 non-micaceous superconducting phase via the deformation of the oxides in "Bi-axial texture in $Ca_{.1}Y_{.9}Ba_2Cu_4O_8$ composite wires made from metallic precursors" L. J. Masur, E. R. Podtburg, C. A. Craven, A. Otto, Z. L. Wang, D. M. Kroeger, J. Y. Coulter and M. P. Maley, Physica C 230 (1994) pp.274–282, the amount of texture was inadequate for attaining non-weak linked Jc in field, and adequately high Jc levels because the bi-axial texture was confined to local regions of each filament, such that regions with high levels of internal biaxial texturing were out of alignment relative to each other. Furthermore, the deformation of the oxide filaments presents the subsequent problem of resintering the fractured oxide particles.

Known techniques for producing epitaxial growth in superconducting ceramics are intrinsically slow and, to date, very expensive, making them unsuitable for the long length conductors needed for most electrical and magnetic applications. It has not heretofore been considered possible to obtain the finely textured substrate layers and thin layers of superconducting material required for epitaxial growth by any low cost, high volume manufacturing method.

Therefore, it is an object of this invention to provide epitaxially grown, highly textured, biaxially aligned superconducting ceramics in forms suitable for long length conductors.

It is also an object of this invention to provide a method for producing these conductors by a low cost process suitable for high volume manufacturing.

SUMMARY OF THE INVENTION

The present invention relates to processes for producing highly textured, biaxially aligned superconducting ceramics in composite conductor forms from metallic precursors, and to the resultant articles. Key aspects of the invention are the fabrication of a composite comprising one or more fine, malleable, substantially planar filaments of an alloy precursor to the superconducting ceramic surrounded by a malleable matrix, at least the interfacial layers of which matrix can be suitably textured, thermomechanically processing the composite in one or more steps at conditions selected to texture at least the interfacial layers of the matrix while the filaments remain in a precursor state, and reaction texturing the filament material to form and texture the desired superconducting ceramic within the composite via quasi-epitaxial growth fostered by the textured interfacial layers and substantially without deformation of the superconducting grains.

By "fine" filaments are meant filaments with at least one dimension less than 5 microns, preferably less than 2 microns, more preferably less than 1 micron and most preferably less than 0.5 microns. Typically, best results will be obtained when the filaments are highly aspected, by which is meant that the cross-section of each filament will typically have an aspect ratio >4:1, preferably greater than 10:1, and most preferably >20:1. However, as will be discussed, a clustering technique may be used to obtain highly textured filaments with lower aspect ratios.

By "substantially planar" filaments are meant filaments for which, over at least 45%, preferably 60%, and most preferably at least 75% of the cross-sectional boundary of the filament adjoining the interfacial layer, the local radius of curvature of the boundary is significantly longer than the average longest dimension of the superconducting ceramic grains. Typically it will be at least 10 times longer, preferably at least 25 times longer, more preferably at least 100 times longer and most preferably at least 500 times longer than the average longest dimension of the grains.

The invention may be practiced with any superconducting ceramic which requires biaxial texturing of its grains. The compounds are preferably superconducting oxides, and particularly of the rare earth, thallium or mercury families of superconducting copper oxides.

The interfacial layers of the matrix may consist of a foil, film, or coating of a first metal, which may be a noble metal, an alloy substantially comprising a noble metal, or an oxidizable metal, while the remainder of the matrix consists of a second metal, which is preferably a noble metal or an alloy substantially comprising a noble metal, including oxide dispersion strengthened (ODS) noble metals. The interfacial layer may partially or fully surround each filament. Alternatively, the entire matrix, including the interfacial layers, may consist of a single metal, preferably a noble metal or its alloy, but in some applications, an oxidizable metal. By "noble metal" is meant a metal whose reaction products are thermodynamically unstable under the reaction conditions employed relative to the desired superconducting ceramic, or which does not react with the superconducting ceramic or its precursors under the conditions of manufacture of the composite. The noble metal may be a metal different from the metallic elements of the desired superconducting ceramic, such as silver or a silver/gold alloy, but it may also be a stoichiometric excess of one of the metallic elements of the desired superconducting ceramic, such as copper. Silver (Ag) and silver alloys are the most preferred noble metals. Zirconium (Zr), niobium (Nb), hafnium (Hf), yttrium (Y), ytterbium (Yb), cerium (Ce), europium (Eu) and alloys substantially comprising these metals are the preferred oxidizable metals.

Specific oxides which are most preferred include the 123, 247, and 124 phases of the YBCO family of rare earth superconducting copper oxides, with partial or complete substitution for Y, if desired, of neodymium (Nd), samarium (Sm), europium (Eu), gadolinium (Gd), terbium (Tb), dysprosium (Dy), holmium (Ho), erbium (Er), thulium (Tm), ytterbium (Yb) or lutetium (Lu), and the 1223 and 1212 phases of the TBCCO family of superconducting oxides. In embodiments using superconducting oxides, the process comprises the steps of: first, forming a precursor composite comprising matrix material surrounding one or more fine, substantially planar precursor filaments comprising a metallic precursor for a desired superconducting oxide; bi-axially texturing the interfacial layers via thermomechanical treatments, at least a portion of which occur during fabrication; oxidizing the composite under conditions selected to preserve or enhance the texture in the interfacial layers and sufficient to form sub-oxide phases in the filaments but insufficient to convert appreciable amounts of the sub-oxide phases into the desired superconducting oxide; and, before, during or after oxidation, heat treating the composite so as to complete the development of bi-axial texture in the interfacial layers; next, reacting the composite using time, temperature and oxygen pressure conditions cooperatively selected to convert some of the suboxide species to grains of the desired superconducting compound, and to promote growth of the superconducting grains in alignment with the biaxially textured interfacial layers. Preferably, the interfacial layers are biaxially textured via a thermomechanical process which includes at least the steps of deformation pretexturing and recrystallization of the interfacial layer. Recrystallization of the interfacial layer may take place during deformation, during oxidation, or between the two, Preferably one recrystallization step occurs at or below 600 C. in a non-oxidizing environment prior to oxidation.

In one aspect of the invention, a noble metal or noble metal alloy, preferably silver, is used to make at least the interfacial layers of the matrix. The interfacial layers are textured by deformation at elevated temperatures, preferably in the range of 170–600 C., at least a portion of which occurs during fabrication of the composite. Before, during or after the initial oxidation to form sub-oxide species in the filaments, the interfacial silver layers are recrystallized to obtain the desired biaxial texture by processing under conditions which inhibit formation of the desired superconducting compound, preferably via an anneal.

In another aspect of the invention, at least the interfacial layers of the matrix are made from an oxidizable metallic alloy. The remainder of the matrix is preferably made from a noble metal or noble metal alloy. Preferred embodiments include a zirconium, cerium, or ytterbium interfacial layer in a remainder matrix of silver or silver alloy. Preferably prior to any oxidation step, pretexturing of the interfacial layers is obtained by deformation followed by heat treatment to obtain recrystallization and grain growth. Thereafter, an oxidation sequence is initiated in which sub-oxide species are formed in the filaments, the interfacial layers are oxidized to form metallic oxide interfacial layers with the desired biaxial texture, and further recrystallization and grain growth of the newly formed oxide interfacial layer may occur.

The invention provides an elongated superconducting composite conductor comprising one or more fine, substantially planar filaments of bi-axially textured superconducting ceramic surrounded by a matrix material, at least the interfacial layers of which matrix material are biaxially textured. In preferred embodiments, the conductor is a multifilamentary conductor and the matrix remains substantially malleable. In preferred embodiments, the average grain to grain c-plane misalignment of the grains in the superconducting ceramic is less than 10 degrees, and the average grain to grain a and/or b-direction misalignment is less than 20 degrees. Moreover, the interfacial layers of the matrix are textured such that the bi-axial texture in the interfacial layers consists of on average less than 10 degrees misalignment of at least one set of planes of the oxide grains relative to each other and less than 20 degrees misalignment of at least one set of directions relative to each other within those planes. Well-textured conductors may be manufactured wherein the oxide fill factor is greater than 10%, preferably greater than 25% and most preferably greater than 40%.

BRIEF DESCRIPTION OF THE DRAWINGS

FIG. 3($a$) is a partial cross-sectional view of a composite precursor showing an interfacial layer which partially surrounds a precursor filament.

FIG. 3($b$) is a partial cross-sectional view of a composite precursor in accordance with the invention, showing an interfacial layer which sandwiches a precursor filament.

FIG. 3($c$) is a partial cross-sectional view of a composite precursor in accordance with the invention, showing an interfacial layer which completely surrounds a precursor filament.

DESCRIPTION OF PREFERRED EMBODIMENTS

The invention provides well-textured, high $J_c$ superconducting composite conductors which are manufacturable by a low cost, easily scalable method. Fill factors greater than 10%, preferably greater than 25%, and most preferably greater than 40%, may be obtained using the process of this invention. "Fill factor" is defined as the measured percentage of superconducting ceramic in a cross-section of the conductor, and is an important determinant of the overall current carrying capacity of the conductor. By contrast, thin film methods typically achieve fill factors in the range of 1–5%.

The invention may be practiced with any superconducting ceramic which requires biaxial texturing of its grains. The compounds are preferably superconducting ceramics of the oxide, sulfide, selenide, telluride, nitride, boron carbide or oxycarbonate types, and most preferably superconducting copper oxides of the rare earth, thallium or mercury families.

Figure 1:
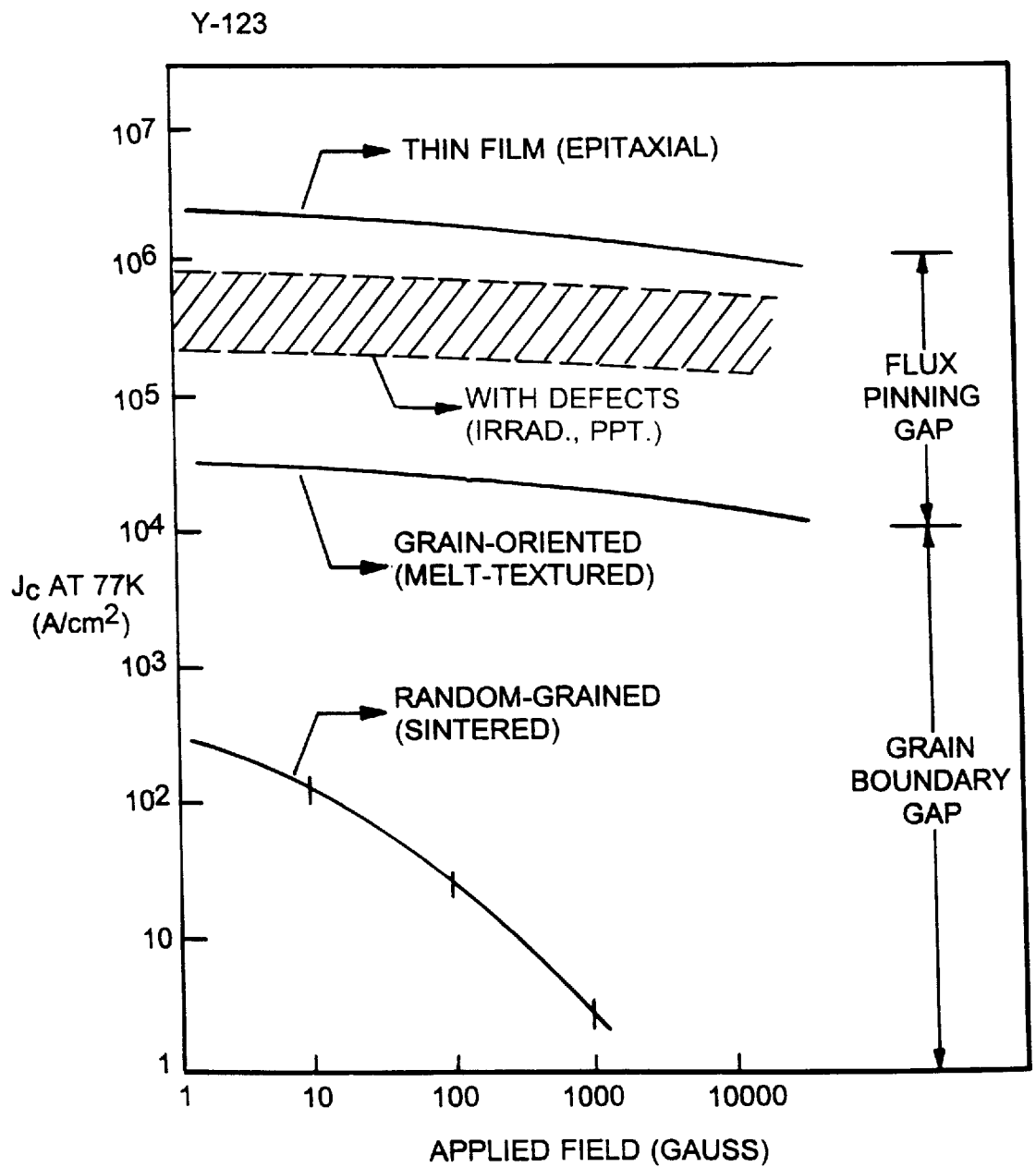
FIG. 1 (prior art) is a graph showing the $J_c$ dependences on applied magnetic field for untextured, bulk melt textured and textured thin film forms of YBCO 123.
Figure 2:
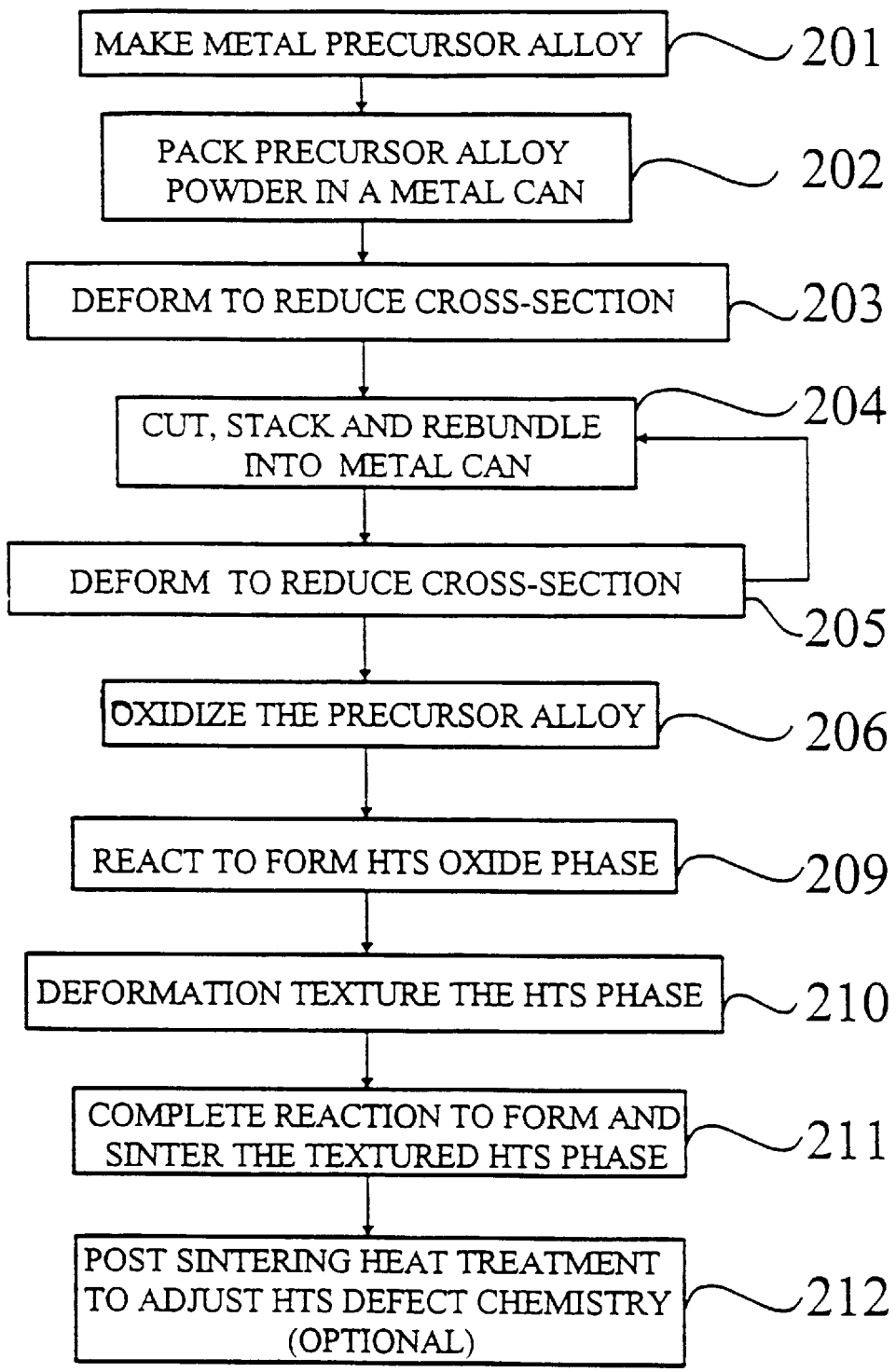
FIG. 2 (prior art) is a block diagram of the steps required to form a composite precursor by the MPIT process.
Figure 4:
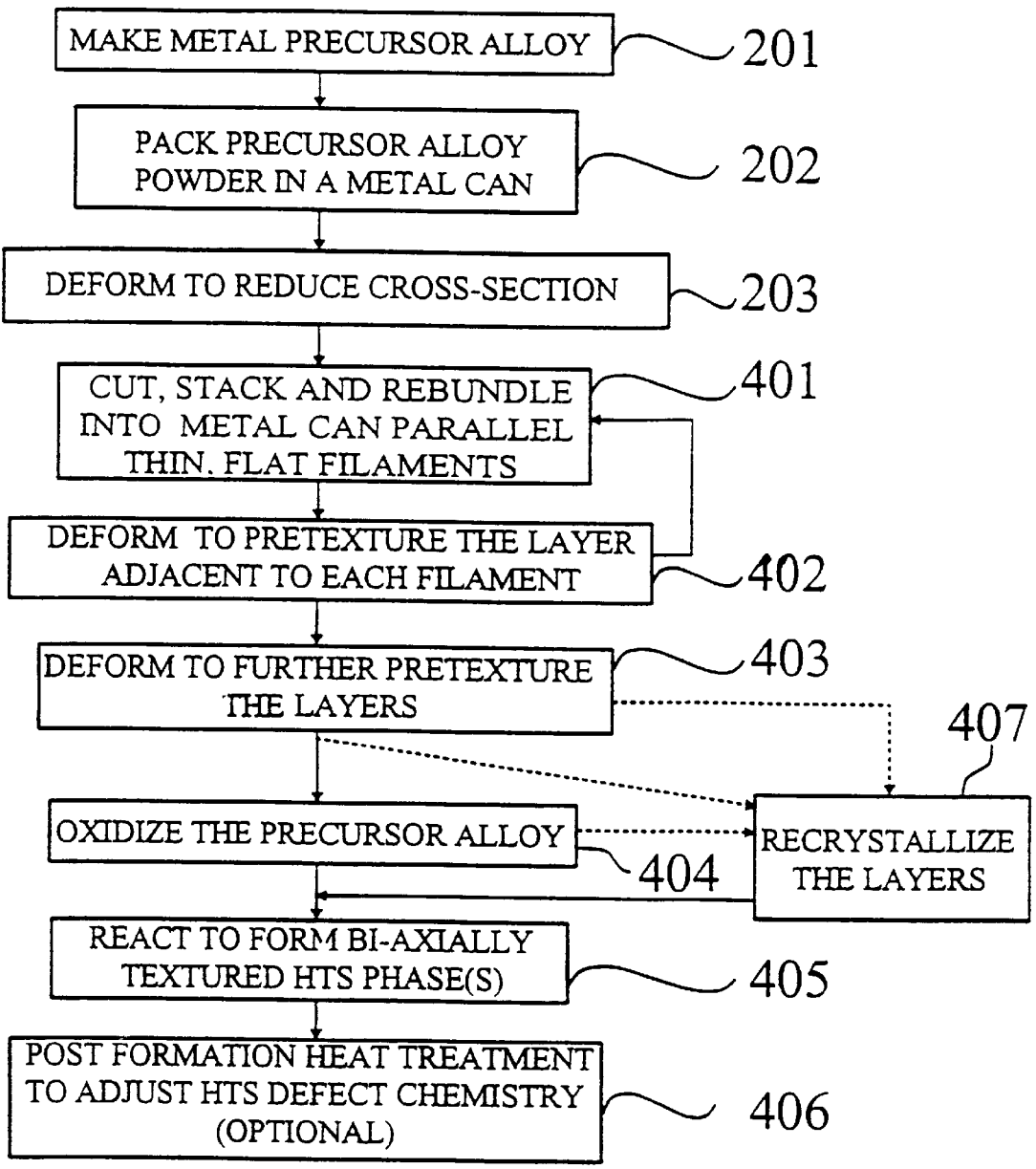
FIG. 4 is a block diagram showing the essential steps of the inventive process.

Referring now to the drawings, FIG. 4 is a block diagram showing the essential steps for making a superconducting oxide composite tape in accordance with the invention. The invention uses portions of the MPIT process (steps 201, 202, 203) to fabricate a precursor composite comprising fine, malleable, substantially planar superconducting ceramic precursor filaments surrounded by a malleable matrix. The MPIT process is particularly well-suited to the formation of composites with many fine, dense, geometrically uniform filaments, which are necessary for the practice of this invention. The relative malleability of all components in the precursor stage of the MPIT process allows more significant reductions per pass and more passes than can be achieved with, for example, the OPIT method.

In step 201, a metal precursor alloy for the desired superconductor is fabricated in accordance with known methods. The precursor alloys are included in amounts sufficient to form the desired superconducting ceramic. The elemental precursors of any superconducting ceramic may be used, and noble metals or inconsequential amounts of other elements may be added. For example, there may be included copper (Cu), yttrium (Y), and barium (Ba) for the YBCO family of copper oxide superconductors, with, if desired, partial or complete substitution of Nd, Sm, Eu, Gd, Tb, Dy, Ho, Er, Tm, Yb or Lu for Y; copper, thallium (Tl), barium, and calcium (Ca) for the TBCCO family of copper oxide superconductors, with, if desired, partial or complete substitution of strontium (Sr) for Ba; or copper, mercury (Hg),with, if desired, partial or complete substitution of lead or bismuth for the mercury, strontium and calcium for the HSCCO family of copper oxide superconductors.

In steps 202 and 203, the alloy powder is packed in first malleable metal can and deformed to create a monofilamentary rod of reduced cross-section. In preferred embodiments of the invention, these rods are cut, stacked and rebundled (step 401) in parallel stacks, and then deformed (step 402) to simultaneously reduce the cross-section of the multifilament bundle and pretexture the matrix layer adjacent to each filament. Steps 401 and 402 are repeated as often as required to obtain tapes with the desired number of thin, flat, parallel stacked filaments of the desired cross-section. Fine, substantially planar filaments are desired to optimize the quasi-epitaxial growth of the superconducting grains. By contrast, in conventional PIT processing, parallel stacks of filaments are typically avoided to minimize the risk of filament merging during processing, and attempts are typically made to minimize the impact of any deformation steps on the matrix material, by, for example, performing intermediate anneals.

Selection of appropriate materials for the matrix is an essential aspect of this invention. An inner surface of the first malleable metal can will become the interfacial layer of the matrix which provides the basis for quasi-epitaxial growth of the desired superconducting ceramic. The interfacial layer may consist of a foil, film, or coating of a first metal while the remainder of the can consists of other metals, preferably noble metals or noble metal alloys. The first malleable metal can may also be made entirely of a single metal suitable for forming the interfacial layer.

In order to be suitable for forming the interfacial layer, the first metal must possess a crystal structure that can be biaxially textured by thermomechanical processing under conditions which will not convert appreciable amounts of the precursor alloy into a superconducting oxide (e.g. deformation at moderate temperatures in a reducing atmosphere), and have appropriate lattice spacing and orientation to promote epitaxial oxide formation during the oxidation and reaction steps of the process. Noble metals, alloys substantially comprising noble metals (which includes ODS strengthened noble metals), or oxidizable metals may be used. If an oxidizable metal is selected, its oxide must be chemically compatible with the desired superconducting oxide, by which is meant that it will not impair the formation or superconducting properties of the superconducting oxide, and it must form a crystal structure and orientation, via its oxidation path from the textured metal interfacial layer, which will promote epitaxial formation of the desired superconducting oxide during the reaction step. The preferred noble metal is silver. The preferred oxidizable metals are zirconium, niobium, hafnium, yttrium, ytterbium, cerium, and europium, with zirconium, cerium and ytterbium being most preferred.

The remainder of the matrix, that is, the second malleable metal can and the outer layers of multicomponent first malleable metal can, may be made from noble metal or an alloy substantially comprising noble metals, including oxide dispersion strengthened (ODS) noble metals. For a few applications, such as current leads, the remainder matrix may consist of an oxidizable metal which forms an oxygen permeable oxide and does not impair the formation or properties of the superconducting oxide under the reaction conditions.

FIG. 3 shows alternative relative orientations between the interfacial layer 303 and the precursor filament 302 in accordance with the invention for an embodiment where the interfacial layer 303 is made from a different material than the remainder of the matrix 301. In FIGS. 3(a) and (b), the interfacial layer 303 partially surrounds a filament 302, forming a single faced-layer in FIG. 3(a) and a sandwich in FIG. 3(b), while in FIG. 3(c) the filament 302 is entirely surrounded by the interfacial layer 303. It is important that the filament be substantially planar in the vicinity of the interfacial layer, as shown in each part of FIG. 3.

Following manufacture of the precursor composite, the interfacial layers are textured. Because the filaments are fine, dense and uniform, good contact between the filaments and the interfacial layers may be maintained throughout the texturing process. The deformation which occurs during fabrication of the composite is preferably performed under conditions which contribute to the pretexturing of the interfacial layers, as will be further discussed below. However, one or more additional thermomechanical processing steps 403 may be done at conditions selected to pretexture at least the interfacial layers of the matrix while the filaments remain in their malleable precursor alloy state, and some of the texturing steps may also be done during or after preliminary oxidation of the alloy filaments to form sub-oxide phases. The composite is then oxidized in step 404 under conditions selected to preserve or enhance the texture. in the interfacial layers adjacent to the filament and sufficient to form sub-oxide species in the filaments from the precursor alloys but insufficient to convert appreciable amounts of the sub-oxide species into the desired superconducting-compound. The oxidation conditions which create fine-grained, dispersed sub-oxide species/phases and minimize segregation of the reactive elements into the matrix and-within the filaments are well-known. YBCO 123, for example, would typically be oxidized at temperatures in the range of 250–350 C. A heat treatment step 407 completes the development of bi-axial texture in the interfacial layer of matrix material adjacent to each filament by recrystallizing the interfacial layer of material.

The appropriate steps and conditions to optimize texture may be selected depending on the nature of the desired interfacial layer. For example, the recrystallization step may be done at any time after the initiation of step 403 and prior to the initiation of superconductor reaction step 405. Preferably at least a portion of the recrystallization will take place at or below 500 C. in a non-oxidizing environment. If the desired interfacial layer consists of a noble metal, the recrystallization may be performed dynamically during deformation step 403 or as a subsequent anneal. If the desired interfacial layer consists of a textured oxide, recrystallization of the interfacial layer in its metal state may be performed during or after step 403 or during oxidation step 404, and a biaxially textured oxide interfacial layer will be formed from the textured interfacial metal layer during step 404. At the conclusion of the texturing/oxidation sequence, biaxial texture will be fully developed in the interfacial layers and no further mechanical deformation will be required, but the filament material will not yet be superconducting. Typically, at this stage, the precursor to the superconducting composite conductor will comprise filaments of a precursor to a desired superconducting oxide surrounded by a substantially malleable metal matrix wherein the interfacial layers of the matrix are textured such that the bi-axial texture in the interfacial layers consists of on average less than 10 degrees misalignment of at least one set of planes of the oxide grains relative to each other and less than 20 degrees misalignment of at least one set of directions relative to each other within those planes.

Finally, after the filaments are oxidized and the texturing of the interfacial layers is completed, the composite will be reacted in step 405 substantially without deformation to form biaxially textured phases of the desired superconducting oxide via quasi-epitaxial growth fostered by the textured interfacial layer. The precursor composite is reacted in an oxidizing atmosphere using time, temperature and oxygen pressure conditions cooperatively selected to convert some of the suboxide species to grains of the desired superconducting compound, and to promote growth of the superconducting grains in alignment with the biaxially textured interfacial layers. Generally speaking, these will be lower temperatures and oxygen pressures than are commonly employed for the reaction step in bulk or PIT processing of the desired superconducting ceramic.

Highly aspected filaments are preferred during the manufacture of the composite, and particularly during the reaction step. However, if filaments with low aspect ratios are desired in the finished superconducting composite, for example, to minimize AC losses, the material and dimensions of the first metal can may be deliberately selected to allow filament merging during reaction step 405. Silver is the preferred material, and the dimensions of the can must be selected so that the silver layer between adjacent filaments in any filament stack in the composite precursor on completion of the deformation step 403 is less than about 1 micron. This allows the silver to diffuse out from between the closely spaced filaments during the reaction step 405 and the filaments to cluster substantially without intervening matrix material, creating highly textured, dense, low aspect ratio metafilaments which are difficult to obtain by conventional PIT or thin film processing techniques.

In a preferred embodiment featuring YBCO-123, the preferred reaction step is a heat treatment lasting between 0.5 and 10 hours in the 600 C. to 900 C. temperature range, and preferably in the 830 C. to 880 C. range at oxygen pressures exceeding the lower limit set by the equation $PO2>=\exp[-32,000/T+23]$ where T is absolute temperature (K) and PO2 is oxygen pressure in atmospheres, preferably with a maximum oxygen pressure of one atmosphere. In one preferred embodiment, the reaction texturing step is in the 830 C. to 880 C. temperature range with an initial portion of the reaction in a low oxygen potential gas at oxygen pressures in the range $PO2<=\exp[-32,000/T+23]$, where T is absolute temperature (K) and PO2 is oxygen pressure in atmospheres, followed by a second portion of the reaction in a higher oxygen pressure environment at oxygen pressures in the range $0.01<PO2<100$ atm. Preferably, in step 406, the composite is then annealed in 0.1–10 atmospheres oxygen using time, temperature and oxygen pressure conditions Cooperatively selected to convert any remaining sub-oxide species, to maximize the growth and sintering of the aligned grains of superconducting compound, or to adjust the defect chemistry of the desired superconducting oxide for optimal performance.

In the finished composite conductor, the average grain to grain c-plane misalignment of the grains in the superconducting ceramic is typically less than 10 degrees, and the average grain to grain a and/or b-direction misalignment is less than 20 degrees. Moreover, the interfacial layers of the matrix are textured such that the bi-axial texture in the interfacial layers consists of on average less than 10 degrees misalignment of at least one set of planes of the oxide grains relative to each other and less than 20 degrees misalignment of at least one set of directions relative to each other within those planes.

In one aspect of the invention, the interfacial layer consists of a noble metal or noble metal alloy, preferably silver or an alloy substantially comprising silver. The remainder of the matrix preferably consists of the same metal or alloy, but a different metal or alloy may be used. The interfacial layers are textured by mechanical processing at elevated temperatures, at least a portion of which occurs during fabrication of the composite, to obtain stored energy in the form of dislocations, grain boundaries, stacking faults and vacancies, followed by recrystallization to form a fully developed bi-axial texture in the interfacial layer.

The silver is preferably pretextured via deformation in the 170 C. to 600 C. range, followed by recrystallization of the silver before, during or after oxidation. Preferred forms of deformation include warm rolling, extrusion, warm stretching, drawing, and combinations of these. Warm rolling is preferably done in the range of 170–600 C., and preferably 230–350 C., to strains in excess of 80%. Extrusion is preferably done in the range of 170–600 C., and preferably 230–350 C., to strains in excess of 98%. Warm stretching is preferably done in the range of 170–600 C. to strains in the range of 1–50% at strain rates in the range of 0.01 to 0.00001 (sec)−1.

In one preferred embodiment of the invention, recrystallization of the silver layer is obtained via an anneal in the 170–600 C. range prior to or during oxidation of the precursor alloy. In another preferred embodiment, low temperature oxidation of the precursor alloy occurs prior to recrystallization of the silver via an anneal in the 200 C. – 900 C. range in a low oxygen pressure environment that inhibits superconducting phase formation, preferably in an environment whose oxygen pressure in atmospheres (PO2) is described by $(PO2<=\exp[-32,000/T+23]$, where T is the temperature in degrees K.

When silver is used to form the interfacial layers, the silver interfacial layers are textured such that on average its {110} planes are within 10 degrees of alignment with the interface between the interfacial layer and the adjacent filament, and on average the <001> directions contained within thesre planes are less than 20 degrees mis-aligned within the filament plane relative to each other in both the precursor and the finished composite conductor.

For the preferred embodiment in which YBCO 123 is the desired superconducting oxide and the desired interfacial layer is textured silver or a textured silver alloy, the preferred method for producing highly textured, biaxially aligned superconducting YBCO 123 in composite conductor forms comprises the steps of: forming a metallic precursor for the 123 phase of yttrium-barium-copper-oxide; introducing the precursor into one or more sheaths wherein at least the interfacial layer which is in intimate contact with the precursor consists substantially of silver or a silver alloy; deforming a bundle comprising one or more filled sheaths in one or more iterations including to form a multifilamentary precursor composite comprising fine, substantially planar malleable precursor filaments; bi-axially texturing the interfacial layers via one or more deformation steps in the 170–600 C. temperature range, at least a portion of which occur during fabrication; then, oxidizing the composite in the 250–350 C. temperature range under conditions selected to preserve or enhance the texture in the interfacial layers and sufficient to form sub-oxide phases in the filaments but insufficient to convert appreciable amounts of the sub-oxide phases into the desired superconducting oxide; then, heat treating the composite so as to recrystallize and thus complete the development of bi-axial texture in the interfacial layers via an anneal in the 200–900 C. temperature range in a low oxygen pressure environment that inhibits superconducting phase formation at oxygen pressures within the limit set by the equation PO2<= exp [−32,000/T+23], where T is absolute temperature (K) and PO2 is oxygen pressure in atmospheres, reaction texturing the filament material at oxygen pressures exceeding the lower limit set by the equation PO2>=exp [−32,000/T+23], where T is absolute temperature (K) and PO2 is oxygen pressure in atmospheres, to form and texture the superconducting YBCO 123 phase within the composite via quasi-epitaxial growth fostered by the textured interfacial layers and substantially without deformation of the superconducting grains; and, then, annealing the composite in 0.1–10 atm oxygen in the 400–600 C. temperature range to adjust the defect chemistry of the YBCO 123 for optimal performance.

In another aspect of the invention, the interfacial layer consists of an oxidizable metal or alloy, preferably zirconium, niobium, hafnium, yttrium, ytterbium, cerium or europium and alloys substantially comprising these metals. The remainder of the matrix preferably consists of a noble metal or alloy, most preferably silver or a silver alloy, to facilitate the oxidation and reaction of the desired superconducting ceramic and preserve the overall malleability of the matrix in the final conductor. However, for those applications such as current leads where a substantially malleable matrix is not required, an oxidizable metal or alloy which forms an oxygen permeable oxide may be used for the remainder of the matrix.

The interfacial layers are textured by a sequence of steps which includes thermomechanical processing, at least a portion of which occurs during fabrication of the composite, to pretexture the metallic interfacial layer; and oxidation, which may occur during the oxidation of the precursor alloy in the filaments, to form a bi-axially textured oxide interfacial layer adjacent to each filament from the pretextured interfacial metal layer. Biaxial pretexture is preferably developed in the interfacial metal layers via deformation and recrystallization in the 170–600 C. temperature range. Oxidation typically occurs in the 250–500 C. temperature range.

This sequence of texturing steps provides a composite precursor comprising filaments of a precursor to a desired superconducting oxide surrounded by a substantially malleable metal matrix wherein the oxide interfacial layers of the matrix are textured. Preferably, the bi-axial texture in the interfacial layers consists of on average less than 10 degrees misalignment of at least one set of planes of the oxide grains relative to each other and less than 20 degrees misalignment of at least one set of directions relative to each other within those planes.

The composite precursor is then reacted to form the desired superconducting ceramic by quasi-epitaxial reaction and texturing of the filament material adjacent to the biaxially textured interfacial oxide layer.

Figure 6:
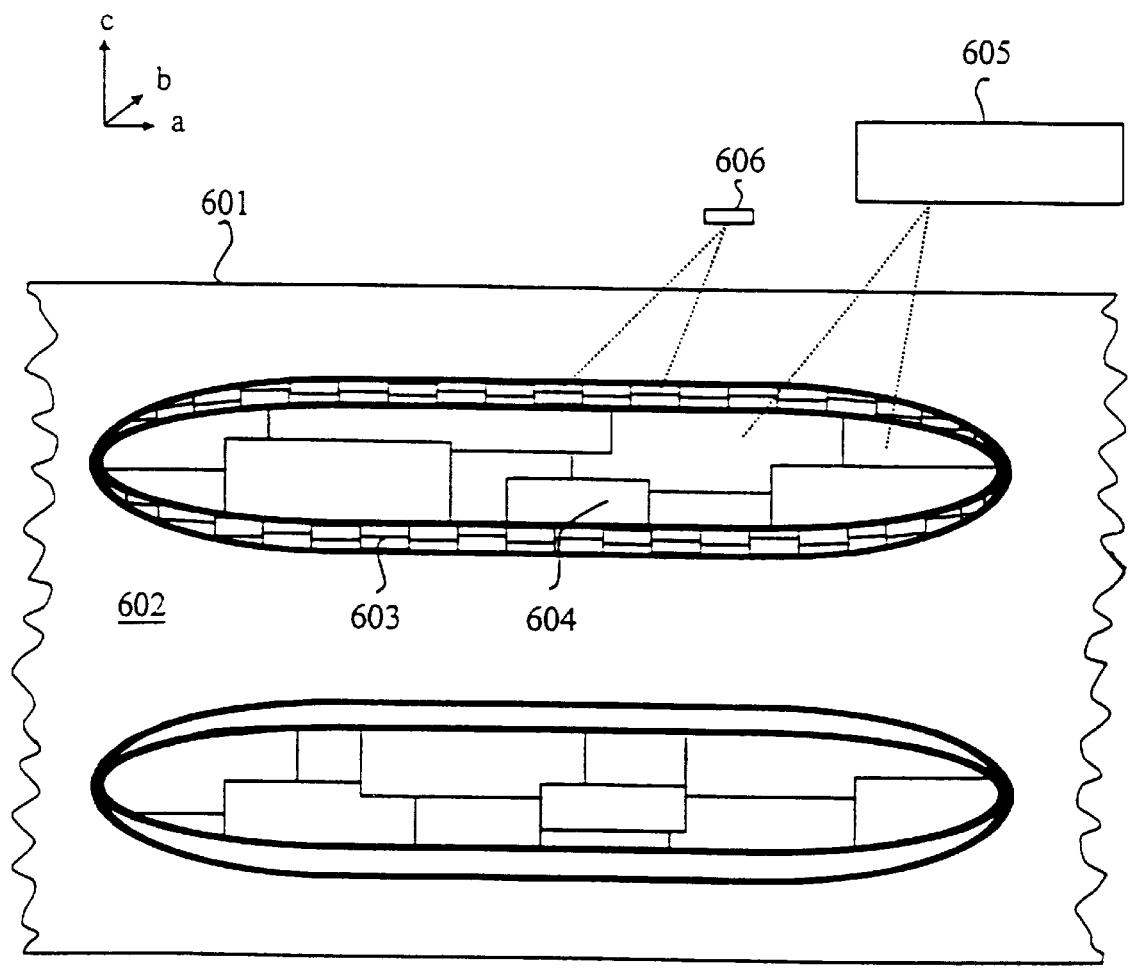
FIG. 6 is a partial cross-sectional view of a composite conductor in accordance with the invention, showing the grain alignment in the textured filaments and interfacial layers.

FIG. 6 is a cutaway perspective view of a conductor 601 manufactured in accordance with this aspect of the invention, using an oxide interfacial layer 603 and a noble metal remainder matrix 602. The grains 606 of the oxide interfacial layer and the grains 605 of the superconducting oxide are substantially aligned. The average grain to grain c-plane (the plane orthogonal to the c axis) misalignment of the grains 605 in the superconducting ceramic is less than 10 degrees, and the average grain to grain a and/or b-direction misalignment of the grains 605 is less than 20 degrees. Moreover, the interfacial layers of the matrix are textured such that the bi-axial texture in the grains 606 of the interfacial layers consists of on average less than 10 degrees misalignment of at least one set of planes of the oxide grains 606 relative to each other and less than 20 degrees misalignment of at least one set of directions relative to each other within those planes.

For the preferred embodiment in which YBCO 123 is the desired superconducting oxide and the interfacial layers are textured oxides, the preferred method for producing highly textured, biaxially aligned superconducting YBCO 123 in composite conductor forms comprises the steps of: forming a metallic precursor for the 123 phase of yttrium-barium-copper-oxide; introducing the precursor into one or more sheaths wherein at least the interfacial layer which is in intimate contact with the precursor consists substantially of an oxidizable metal selected from the group consisting of zirconium, niobium, hafnium, yttrium, ytterbium, cerium or europium and alloys substantially comprising these metals; deforming a bundle comprising one or more filled sheaths in one or more iterations to form a multifilamentary precursor composite comprising fine, substantially planar malleable precursor filaments; bi-axially pretexturing the interfacial metal layers via one or more deformation and recrystallization steps in the 170–600 C. temperature range, at least a portion of which occur during fabrication; then, oxidizing the composite in the 250–500 C temperature range under conditions selected to form a bi-axially textured oxide interfacial layer adjacent to each filament from the pretextured interfacial metal layer, and to form sub-oxide phases in the filaments but not to convert appreciable amounts of the sub-oxide phases into the desired superconducting oxide; then, reaction texturing the filament material at oxygen pressures exceeding the lower limit set by the equation PO2>=exp[−32,000/T+23], where T is absolute temperature (K) and PO2 is oxygen pressure in atmospheres, to form and texture the superconducting YBCO 123 phase within the composite via quasi-epitaxial growth fostered by the textured interfacial layers and substantially without deformation of the superconducting grains; and, then annealing the composite in 0.1–10 atm oxygen in the 400–600 C. temperature range to adjust the defect chemistry of the YBCO 123 for optimal performance.

The preferred embodiments of the invention may be further understood from the following examples:

EXAMPLE 1

Precursor tapes were fabricated with 1,024 highly aspected, planar filaments across the tape cross-sections and filament thicknesses in the 0.8 to 2 micron range using YBCO 123 metallic precursor powder in a silver matrix. The metallic precursor alloy powder was fabricated with a nominal composition of about Y:1, Ba:2, Cu:3.5 with 20 weight % Ag added to reduce the reactivity of the precursor during handling. Excess copper was added to ensure that the stoichiometry of the precursor would not be reduced below Cu:3 by segregation during oxidation. In the first step, a silver billet was packed with the Y-Ba-Cu-Ag alloy precursor to the Y-123 superconducting oxide that was then extruded at 330 C. to a 0.03" thick by 0.15" wide monofilament tape. The tape was then cut into nominally 4" lengths, and 32 lengths were rebundled in a stack such that all the large surfaces of the rectangular cross-sectioned tapes were parallel. The stack was inserted into a silver billet and extruded again at 330 C. to a 0.03"×0.15" cross-sectioned tape such that the large surfaces of the extruded tape were parallel to the prior large flat surfaces of the tape pieces of the rebundled stack. This rebundling and extrusion sequence was repeated, with the final extrusion to a 0.02"×0.100" cross-sectioned tape containing 1,024 planar, highly aspected filaments arranged such that their large surfaces were roughly parallel to the tape large surface. The tape samples were then oxidized in a high oxygen pressure environment at similar temperatures to the temperatures employed in extrusion. After oxidation, the samples were annealed in a copper metal gettered environment at 350 C. for 60 hours to reduce oxygen potential within each filament below the stability level of Y-123.

Finally the tape samples were recrystallized at 850 C. initially in a copper gettered gas environment for different times in the 0.5 to 2 hour range in the 830 C. to 890 C. temperature range, followed by an increase in oxygen potential to 0.075 or 1.00 atm and additional baking at the corresponding temperature for up to 2 hours to form the Y-123 phase. All samples were then subjected to a 45 hour anneal in 1.00 atm oxygen pressure environment at 450 C. and their critical current densities (Jc's) at 77 K were measured. Jc dependences on heat treat temperature in the 830 C. to 890 C. range, Y-123 reaction oxygen pressure and oxidation temperature are illustrated in Table 1. The maximum Jc level attained was 5.4 kA/cm2 at 77 K, more than 10-fold the Jc level of untextured Y-123. The optimal reaction temperature was in the 845–865 C. range, and the optimal time combining the recrystallization and Y-123 formation was in the 1 hour to 3 hour range. The low oxygen pressure initial heat treat portion to recrystallize the silver followed by completion of the Y-123 formation reaction at the higher oxygen potential showed the best Jc levels. SEM examination of sample cross-sections showed that the thinner nominally 0.8 micron thick filaments exhibited very high degrees of c-plane alignment with the flats of the filaments and the tapes, with progressively worse alignment for the thicker filaments.

TABLE 1

Jc dependences on various recrystallization conditions at low oxygen pressures and Y-123 forming conditions at higher, near ambient oxygen pressure conditions (note, untextured Y-123 Jc = 0.3 kA/cm2 at 77 K).

| oxidation Temp. (C.) | heat treatment* | | Jc at 77 K (kA/cm2) |
| --- | --- | --- | --- |
| | recrystallization | Y-123 formation | |
| 330 C. | (2 hr. 830 C. - Cu set PO2), | (0.5 hr 830 C. - .075 atm O2) | 3.45 |
| 330 C. | (2 hr. 850 C. - Cu set PO2), | (0.5 hr 850 C. - .075 atm O2) | 4.51 |
| 330 C. | (2 hr. 870 C. - Cu set PO2), | (0.5 hr 870 C. - .075 atm O2) | 4.36 |
| 330 C. | (2 hr. 890 C. - Cu set PO2), | (0.5 hr 890 C. - .075 atm O2) | 2.50 |
| 330 C. | (2 hr. 850 C. - Cu set PO2), | (0.5 hr 850 C. - 1.0 atm O2) | 4.62 |
| 290 C. pre-ox 330 C. finish | (2 hr. 850 C. - Cu set PO2), | (0.5 hr 850 C. - 1.0 atm O2) | 5.41 |

Figures 5A, 5B:
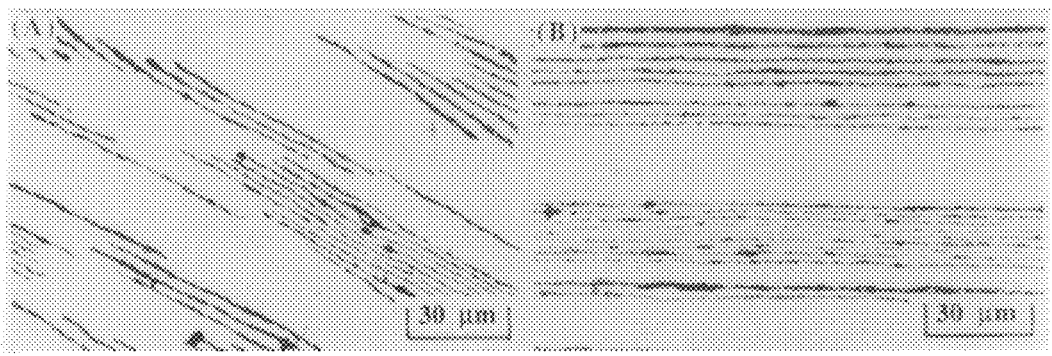
FIG. 5 is a set of photomicrographs showing four views of a 1,024 figment tape made as described in Example 1.
Figures 5C, 5D:
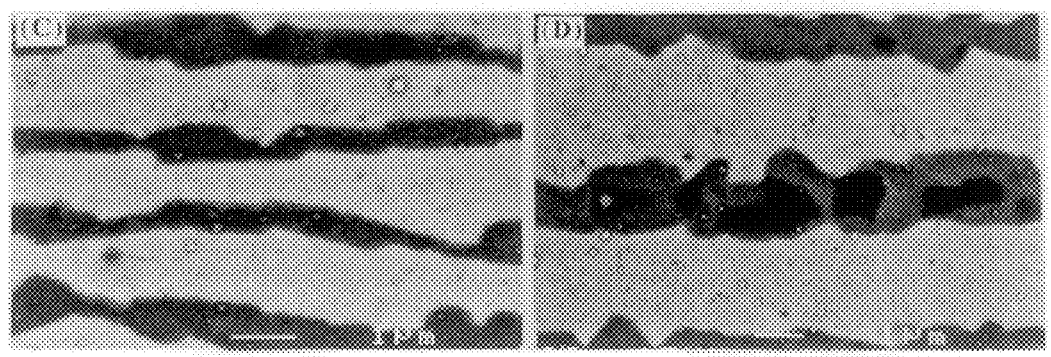

*oxidation was followed by a 60 hour heat treatment at 350 C. in Cu metal gettered argon gas, and the specified heat treatment was followed by a 45 hour anneal in 1 atm oxygen at 450 C.
Cu - means argon gas was gettered for oxygen with Cu metal at the heat treat temperature FIG. 5 shows a set of 4 photomicrographs of the tape. FIG. 5(a) is a short-transverse optical view. FIG. 5(b) is a longitudinal optical view. FIG. 5(c) is a longitudinal SEM (scanning electron micrograph) of fine filaments showing excellent grain alignment. FIG. 5(d) is a longitudinal SEM of thicker fialments showing poorer grain alignment and thereby demonstrating the quasi-epitaxial nature of the grain texturing process.

EXAMPLE 2

Precursor tapes (0.03" thick by 0.15" wide) containing 32 filaments were made as described in example 1 using YBCO 123 metallic precursor powder in a silver matrix. The 32 filament bundles were sheet rolled in nominally 15% reductions per pass at 450 C. in an inert environment via a heated roll rolling mill. The total strains were in the 60% to 90% range, with filament thicknesses in the 1.5 to 4 micron range in the 90% rolled sample. Samples were oxidized at 330 C., followed by an anneal at 350 C. in a low oxygen potential environment (using Cu metal as an oxygen getter in argon gas at 100 atm total pressure to minimize blistering due to gas evolution), followed by a first low oxygen pressure anneal at 850 C., and a second higher oxygen pressure Y-123 forming bake at 850 C., followed by a 45 hour anneal in 1.00 atm oxygen at 450 C. Sample Ic's were measured at 77 K using the series four point probe method. Jc data in Table 2 illustrates that Jc values exceeded the values of untextured samples by more than 5-fold even though the filaments in these samples were considerably thicker than the filaments described in example 1.

TABLE 2

Jc's of two warm rolled samples to 7.5 mil from 30 mil (75% strain) followed by oxidation (note, untextured Y-123 Jc = 0.3 kA/cm2 at 77 K), and various reaction paths.

| oxidation Temp. (C.) | heat treatment* | | Jc at 77 K (kA/cm2) |
| --- | --- | --- | --- |
| | recrystallization | Y-123 formation | |
| 330 C. | (2 hr. 850 C. - Cu set PO2), | (0.5 hr 850 C. - .075 atm O2) | 2.1 |
| 330 C. | (20 hr. 350 C. - Cu set PO2, 1 atm total pressure) (2 hr. 850 C. - Cu set PO2), | (0.5 hr 850 C. - .075 atm O2) | 1.8 |

*oxidation was followed by an 80 hour heat treatment at 350 C. in Cu metal gettered argon gas at 100 atm total pressure, and the specified heat treatment was followed by a 45 hour anneal in 1 atm oxygen at 450 C.
Cu - means argon gas was gettered for oxygen with Cu metal at the heat treat temperature

EXAMPLE 3

A metal precursor alloy to the Tl-1223 superconducting oxide is made by mechanically alloying the elements. Metal precursor/silver matrix composite tape (nominally 0.03" thick by 0.15" wide) containing between 1 and 1,000,000,000 filaments are then made as described in example 1, followed by sheet or bar rolling in nominally 9% to 25% reductions per pass in the 160 C. to 500 C. temperature range in an inert environment. The total strains are in the 80% to 98% cross-sectional area reduction range, with filament thicknesses in the 6 micron to 0.3 micron range.

In some samples, the silver matrix is recrystallized in an inert or reducing gas environment to attain the desired bi-axial texture ({110}<001>) in the silver adjacent to each filament prior to or during oxidation. The precursor is oxidized at conditions that inhibit segregation (290 C. to 350 C. range). The samples are reacted to form biaxially textured Tl-1223 in the filaments in the 800 C. to 920 C. range in a 0.01 atm to 100 atm oxygen pressure range adjacent to the silver matrix that is bi-axially textured via recrystallization before oxidation, thereby forming bi-axially textured Tl-1223 in the filament such that the c directions of the grains are on average less than 10 degrees out of alignment, while the a and b directions in the plane of the filaments are less than 20 degrees out of alignment relative to any common direction, resulting in enhanced Jc levels in these filaments as compared to less textured Tl-1223 forms.

In other samples, the bi-axially textured silver is formed by oxidizing the as-rolled tape followed by oxygen pressurelowering anneal bakes consisting of 1 to 200 hours in the 200 C. to 450 C. temperature range in a low oxygen potential environment (using for example Cu metal as an oxygen getter in argon gas) followed by a first low oxygen pressure (PO2<=0.01 atm) anneal in the 450 C. to 850 C. range, and a second higher oxygen pressure bi-axially textured Tl-1223 forming bake in the 800 C. to 920 C. temperature range and 0.01 atm<PO2<100 atm. oxygen pressure range. Bi-axially textured Tl-1223 is formed in the filament such that the c-directions of the grains are on average less than 10 degrees out of alignment, while the a and b directions in the plane of the filaments are less than 20 degrees out of alignment relative to each other, resulting in enhanced Jc levels in these filaments as compared to less textured Tl-1223 forms.

In some cases, a mechanical or gas pressure environment is imposed in addition to the oxygen pressure to inhibit blistering, distortion, swelling or separation between portions of the filaments and the silver matrix.

In some samples, the metal precursor may consist of two alloys, one rich in Tl and the other containing the remaining elements required to form the Tl-1223. The filaments are then fabricated so as to consist of filament regions containing one alloy and other adjacent regions containing the other alloy in proportions suitable on any cross-section overall for forming the T-1223. This sort of configuration is then processed according to either path described above.

As part of the silver pretexturing, extrusion, rolling, drawing and stretching in the 160 C. to 500 C. temperature ranges may all be employed.

The various features and advantages of the invention may be seen from the foregoing description. Iterative variations on the steps described above will be seen to be within the scope of the invention. Many modifications and variations in the preferred embodiments illustrated will undoubtedly occur to those versed in the art, as will various other features and advantages not specifically enumerated, all of which may be achieved without departing from the spirit and scope of the invention as defined by the following claims.

What I claim is:

1. A method for producing highly textured, biaxially aligned superconducting ceramics in composite conductor forms comprising the steps of:

fabricating a composite precursor comprising a plurality of fine, malleable, substantially planar filaments of an alloy precursor to a desired superconducting ceramic surrounded by a malleable matrix, wherein at least the interfacial layers of which matrix can be suitably textured, thermomechanically processing the composite precursor in one or more steps at conditions selected to texture at least the interfacial layers of the matrix without converting appreciable amounts of the composite precursor to the desired superconducting oxide to form a preliminary filament material having no appreciable amounts of the desired superconducting oxide, and then reaction texturing the preliminary filament material to form and texture the desired superconducting ceramic within the composite via growth fostered by the textured interfacial layers and substantially without deformation of the superconducting grains, where the reaction texturing step is a heat treatment in the 830 C. to 880 C. range with an initial portion of the reaction in a low oxygen potential gas at oxygen pressures in the range PO2<=exp [−32,000/T+23], where T is absolute temperature (K) and PO2 is oxygen pressure having a value in a range of from 0.002 to 0.009 atmospheres, followed by a second portion of the reaction in a higher oxygen pressure environment at oxygen pressures in the range 0.01<PO2<100 atmospheres.

2. A method according to claim 1 wherein the step of fabricating the composite precursor comprises the steps of:

forming a metallic precursor for a desired superconducting compound and introducing the precursor into one or more sheaths comprising a noble metal or its alloy, and deforming a bundle comprising one or more filled sheaths in one or more iterations to form a precursor composite comprising one or more fine, substantially planar precursor filaments.

3. A method according to claim 2 wherein the desired superconducting ceramic is a superconducting oxide.

4. A method according to claim 3 wherein the thermomechanical processing steps comprise the steps of:

bi-axially texturing the interfacial layers via thermomechanical treatments, at least a portion of which occur during fabrication;

oxidizing the composite under conditions selected to preserve or enhance the texture in the interfacial layers and sufficient to form sub-oxide phases in the filaments but insufficient to convert appreciable amounts of the sub-oxide phases into the desired superconducting oxide; and, before, during or after oxidation, heat treating the composite so as to complete the development of bi-axial texture in the interfacial layers.

5. A method according to claim 1 wherein an interfacial layer substantially surrounds each filament.

6. A method according to claim 1 wherein an interfacial layer partially surrounds each filament.

7. A method according to claim 1 wherein the composite conductor is a multifilamentary composite conductor.

8. A method according to claim 4 wherein the thermomechanical processing steps include additional deformation after fabrication.

9. A method according to claim 4 wherein at least one heat treatment occurs before oxidation under conditions selected to recrystallize the interfacial layer in its malleable metal state.

10. A method according to claim 9 where the recrystallization of the interfacial metal layer takes place at or below 600 C. in a non-oxidizing environment.

11. A method according to claim 3 wherein the desired superconducting oxide is a member of the rare earth family of superconducting copper oxides.

12. A method according to claim 11 wherein the desired superconducting oxide is one of the yttrium-barium-copper-oxide superconducting phases.

13. A method according to claim 12 wherein the desired superconducting oxide is YBCO 123.

14. A method according to claim 12 wherein the desired superconducting oxide is YBCO 124.

15. A method according to claim 12 wherein the desired superconducting oxide is YBCO 247.

16. A method according to claim 3 wherein the desired superconducting oxide is one of the thallium-barium-calcium-copper-oxide phases.

17. A method according to claim 16 wherein the desired superconducting oxide is Tl-1223.

18. A method according to claim 16 wherein the desired superconducting oxide is Tl-1212.

19. A method according to claim 13 wherein the reaction texturing step is a heat treatment in the 600 C. to 900 C. temperature range at oxygen pressures exceeding the lower limit set by the equation PO2>=exp[−32,000/T+23] where T is absolute temperature (K) and PO2 is oxygen pressure in atmospheres with a maximum oxygen pressure of one atmosphere.

20. A method according to claim 19 wherein the reaction texturing step lasts between 0.5 and 10 hours.

21. A method according to claim 19 wherein the reaction texturing step is in the 830 C. to 880 C. temperature range.

22. A method for producing highly textured, biaxially aligned superconducting ceramics in composite conductor forms comprising the steps of:
 forming a metallic precursor for a YBCO 123 superconducting compound and introducing the precursor into a plurality of sheaths, each sheath comprising a noble metal or its alloy,
 deforming a bundle comprising the sheaths in one or more iterations to form a precursor composite comprising fine, substantially planar precursor filaments surrounded by a malleable matrix having interfacial layers,
 thermomechanically processing the composite precursor in one or more steps at conditions selected to texture at least the interfacial layers of the matrix without converting appreciable amounts of the composite precursor to the desired superconducting oxide to form a preliminary filament material having no appreciable amounts of the desired superconducting oxide, and then
 reaction texturing the Preliminary filament material to form and texture the desired superconducting ceramic within the composite via growth fostered by the textured interfacial layers and substantially without deformation of the superconducting grains, where the reaction texturing step is a heat treatment in the 830 C. to 880 C. range with an initial portion of the reaction in a low oxygen potential gas at oxygen pressures in the range $PO2<=\exp[-32,000/T+23]$, where T is absolute temperature (K) and PO2 is oxygen pressure having a value in a range of from 0.009 to 0.002 atmospheres, followed by a second portion of the reaction in a higher oxygen pressure environment at oxygen pressures in the range $0.01<PO2<100$ atmospheres.

23. A method according to claim 13 wherein the composite is then annealed in 0.1–10 atmospheres oxygen using time, temperature and oxygen pressure conditions cooperatively selected to convert any remaining sub-oxide species, to maximize the growth and sintering of the aligned grains of superconducting compound, or to adjust the defect chemistry of the desired superconducting oxide for optimal performance.

24. A method according to claim 23 wherein the oxidation step is in the 250 C. to 500 C. temperature range.

25. A method according to claim 24 wherein the oxidation step is in the 250 C. to 350 C. temperature range.

26. A method according to claim 1 wherein the filaments are highly aspected.

27. A method according to claim 4 wherein at least the interfacial layers of the matrix consist of a noble metal or noble metal alloy.

28. A method according to claim 27 wherein the noble metal is silver.

29. A method according to claim 28 wherein the remainder of the matrix comprises different metals or alloys.

30. A method according to claim 28 wherein the remainder of the matrix consists of the same metal or alloy.

31. A method according to claim 4 wherein the interfacial layers are textured by mechanical processing at elevated temperatures, at least a portion of which occurs during the fabrication step, and recrystallization to form a fully developed bi-axial texture.

32. A method according to claim 31 wherein the mechanical processing is deformation in the 170 C. to 600 C. temperature range.

33. A method according to claim 32 wherein the deformation is warm rolling, extrusion, warm stretching, drawing, or a combination of these.

34. A method according to claim 33 wherein the warm rolling is done in the 170–600 C. temperature range to strains in excess of 80%.

35. A method according to claim 34 wherein the warm rolling is done in the 230–350 C. temperature range.

36. A method according to claim 33 wherein the extrusion is done in the 170–600 C. temperature range to strains in excess of 98%.

37. A method according to claim 36 wherein the extrusion is done in the 230–350 C. temperature range.

38. A method according to claim 33 wherein the warm stretching is done in the range of 170–600 C. to strains in the range of 1–50% at strain rates in the range of 0.01 to 0.00001 (sec)−1.

39. A method according to claim 31 wherein the interfacial layer is recrystallized before the oxidation step.

40. A method according to claim 31 wherein the interfacial layer is recrystallized during the oxidation step.

41. A method according to claim 31 wherein the interfacial layer is recrystallized via an anneal in the 200–500 C. temperature range prior to or during the oxidation step.

42. A method according to claim 28 wherein the interfacial layer is recrystallized after the oxidation step.

43. A method according to claim 42 wherein the interfacial layer is recrystallized after the oxidation step via an anneal in the 200 C.– 900 C. range in a low oxygen pressure environment that inhibits superconducting phase formation.

44. A method according to claim 43 wherein the anneal takes place at oxygen pressures within the limit set by the equation $PO2<=\exp[-32,000/T+23]$, where T is absolute temperature (K) and PO2 is oxygen pressure in atmospheres.

45. A method according to claim 31 wherein the interfacial layers of the matrix are textured such that the bi-axial texture in the interfacial layers consists of on average less than 10 degrees misalignment of at least one set of planes of the grains relative to each other and less than 20 degrees misalignment of at least one set of directions relative to each other within those planes.

46. A method according to claim 4 wherein at least the interfacial layers of the matrix consist of an oxidizable metal or alloy.

47. A method according to claim 46 wherein the noble metal is selected from the group consisting of zirconium, niobium, hafnium, yttrium, ytterbium, cerium or europium.

48. A method according to claim 47 wherein the remainder of the matrix comprises noble metals or noble metal alloys.

49. A method according to claim 47 wherein the remainder of the matrix consists of the same metal or alloy.

50. A method according to claim 46 wherein the interfacial layers are textured by a sequence of steps which includes thermomechanical processing, at least a portion of which occurs during fabrication of the composite, to pretexture the metallic interfacial layer; and oxidation, which may occur during the oxidation of the precursor alloy in the filaments, to form a bi-axially textured oxide interfacial layer adjacent to each filament from the pretextured interfacial metal layer.

51. A method according to claim 50 wherein biaxial pretexture is developed in the interfacial metal layers via deformation and recrystallization in the 170–600 C. temperature range.

52. A method according to claim 50 wherein the interfacial layers of the matrix are textured such that the bi-axial texture in the interfacial layers consists of on average less than 10 degrees misalignment of at least one set of planes of the oxide grains relative to each other and less than 20 degrees misalignment of at least one set of directions relative to each other within those planes.

53. A method for producing highly textured, biaxially aligned superconducting YBCO 123 in composite conductor forms comprising the steps of:

forming a metallic precursor for the 123 phase of yttrium-barium-copper-oxide;

introducing the precursor into a plurality of sheaths to form a plurality of filled sheaths, wherein interfacial layers are in intimate contact with the precursor and consist substantially of silver or a silver alloy;

deforming a bundle comprising the filled sheaths in one or more iterations including to form a multifilamentary precursor composite comprising fine, substantially planar malleable precursor filaments;

bi-axially texturing the interfacial layers via one or more deformation steps in the 170–600° C. temperature range;

then, oxidizing the composite in the 250°–350° C. temperature range under conditions selected to preserve or enhance the texture in the interfacial layers and sufficient to form sub-oxide phases in the filaments but insufficient to convert appreciable amounts of the sub-oxide phases into a desired superconducting oxide; and, before, during or after oxidation, heat treating the composite so as to complete the development of bi-axial texture in the interfacial layers via an anneal in the 200°–900° C. temperature range in a low oxygen pressure environment that inhibits superconducting oxide phase formation at oxygen pressures within the limit set by the equation $PO2 <= \exp[-32,000/T+23]$, where T is absolute temperature (K) and PO2 is oxygen pressure having a value in a range of from $4 \times 10^{-20}$ to 0.01 atmospheres, wherein the oxidizing and heat treating steps form a preliminary filament material;

then, reaction texturing the preliminary filament material at oxygen pressures exceeding the lower limit set by the equation $PO2 >= \exp[-32,000/T+23]$, where T is absolute temperature (K) and PO2 is oxygen pressure having a value in the range $0.01 < PO2 < 100$ atmospheres, to form and texture the superconducting YBCO 123 phase within the composite via growth fostered by the textured interfacial layers and substantially without deformation of the superconducting grains; and, then annealing the composite in 0.1–10 atm oxygen in the 400°–600° C. temperature range to adjust the defect chemistry of the YBCO 123 for optimal performance.

* * * * *